United States Patent [19]

Hartmann et al.

[11] Patent Number: 5,015,960
[45] Date of Patent: * May 14, 1991

[54] METHOD OF GENERATING A VOLTAGE WITH A TRIANGULAR WAVE FORM

[75] Inventors: Uwe Hartmann, Untergriesbach; Fritz Ohnemus, Villingen-Schwenningen, both of Fed. Rep. of Germany

[73] Assignee: Deutsche Thomson-Brandt GmbH, Villingen-Schwenningen, Fed. Rep. of Germany

[*] Notice: The portion of the term of this patent subsequent to Jun. 20, 2006 has been disclaimed.

[21] Appl. No.: 345,039

[22] Filed: Apr. 28, 1989

[30] Foreign Application Priority Data

Apr. 29, 1988 [DE] Fed. Rep. of Germany ....... 3814561

[51] Int. Cl.⁵ .................. H03K 5/08; H03K 4/10; H03K 5/00; H03K 12/00
[52] U.S. Cl. .................. 328/36; 328/32; 328/181; 328/187; 307/261; 307/264; 307/228
[58] Field of Search .............. 307/228, 261, 268, 529, 307/264; 328/181, 36, 187, 32; 358/159

[56] References Cited

U.S. PATENT DOCUMENTS 4,216,387 8/1980 Reed .................................. 307/228
4,841,251 6/1989 Hartmann et al. ................ 328/36

FOREIGN PATENT DOCUMENTS 3701927 8/1988 Fed. Rep. of Germany .

Primary Examiner—Stanley D. Miller
Assistant Examiner—Trong Phang
Attorney, Agent, or Firm—Max Fogiel

[57] ABSTRACT

A method for generating a voltage with a triangular waveform which is independent of frequency. Two oppositely-phased voltages with sawtooth waveforms are added together in an adding circuit. These two waveforms have different amplitudes, and one of the waveforms has a horizontal section during predetermined intervals of a period. The resulting triangular waveform has points at which the waveform passes through zero, and these points coincide with the points at which the sawtooth waveforms pass through zero also. These points at which the waveforms pass through zero corresponds to 0°, 180°, and 360° of a waveform cycle for eliminating substantially gullwing errors in television sets. These points correspond to the beginning, center and end of lines in the television sets.

9 Claims, 2 Drawing Sheets

METHOD OF GENERATING A VOLTAGE WITH A TRIANGULAR WAVE FORM

The invention concerns a method of generating a voltage with a sawtooth waveform by adding two oppositely phased voltages with sawtooth waveforms, one of which has a horizontal wave form during specific intervals of a period T, in an adding circuit.

The prior patent application P 3 701 927.9 describes a method of generating a triangular voltage in order to create a correction current that is coupled into the vertical-deflection circuit of a television receiver to eliminate the "gull-wing" distortions that are particularly and annoyingly apparent on flat-screen picture tubes. Correction circuits are necessary for this particular type of picture tube to generate a phase-appropriate fundamental wave at the frequency of the deflection current. Although the use of filtering circuits and even synchronized oscillator circuits is known, they must be tuned to the fundamental wave, which requires additional circuitry that adds to the expense. When such a circuit is to be employed with several vertical deflection frequencies as desired, the correction circuit must be compensated for each frequency. Using different deflection frequencies is very common to obtain higher picture resolution and to eliminate disturbing flicker on the screen. Future television receivers will be able to handle deflection frequencies of 50, 60, 100, or even 120 Hz.

The aforesaid application describes a method of generating the requisite wave form whereby two voltages with prescribed waveforms and with the same amplitude are added. Measurements have revealed that gull-wing distortions extend sinusoidally from the upper to the lower edge of the picture. They pass through zero at the upper edge, in the center, and at the bottom edge. The error can be positive for example during the first flyback lines, extend sinusoidally through zero, attain a negative maximum in the upper half of the picture, pass through zero again at the center, attain a positive maximum in the lower half of the picture, and exceed zero again in the negative direction a few lines before the end of the flyback. Obviously, then, the triangular voltage generated as described in Application P 3 701 027.9 must be additionally modified at the upper and lower edge of the picture to compensate for the "inverted" deviations.

The object of the present invention is to provide a means of obtaining such modifications. This object is attained in accordance with the major claim. Further embodiments of the invention will be evident from the subsidiary claims.

The invention will now be described with reference to the drawing, wherein

The function of the circuit disclosed in Patent Application P 3 701 927.9 for eliminating the aforesaid gull-wing error illustrated in Figure 1a will first be described with reference to FIG. 1. The features particular to the invention will then be described with reference to FIG. 2.

Figure 1:
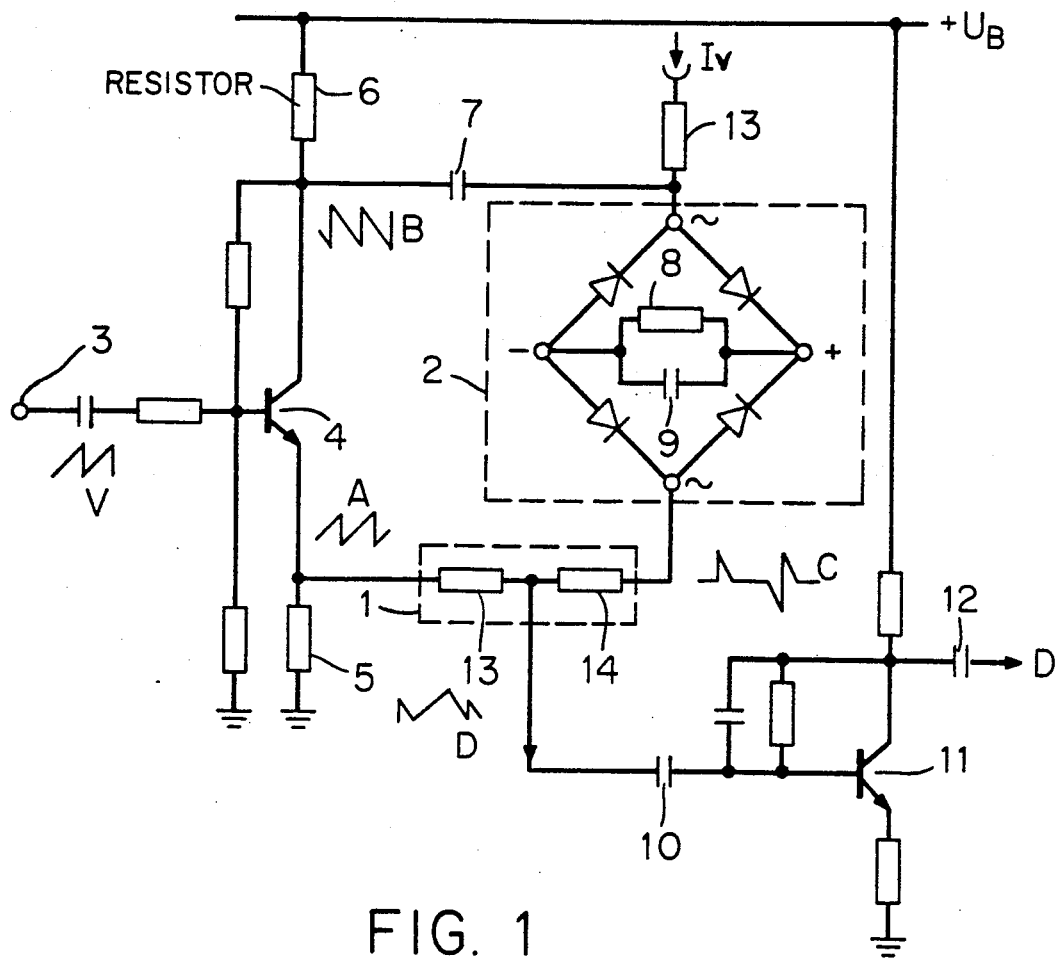
FIG. 1 illustrates the circuitry in accordance with the invention.
Figure 1A:
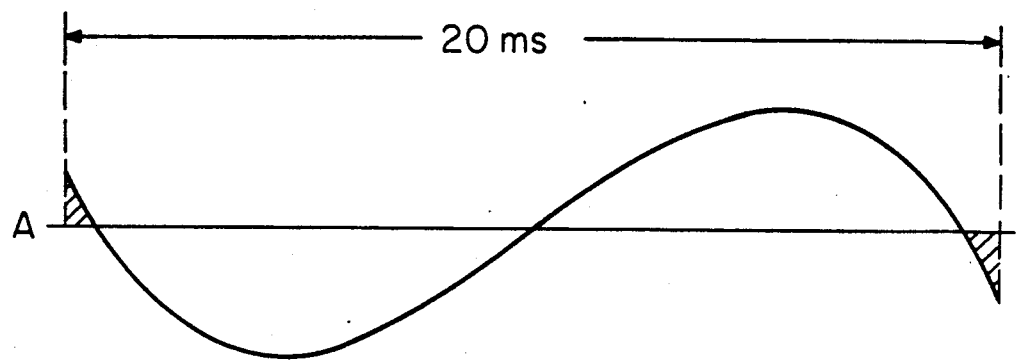
FIG. 1a is a graphical representation of the gull-wing error.
Figure 2:
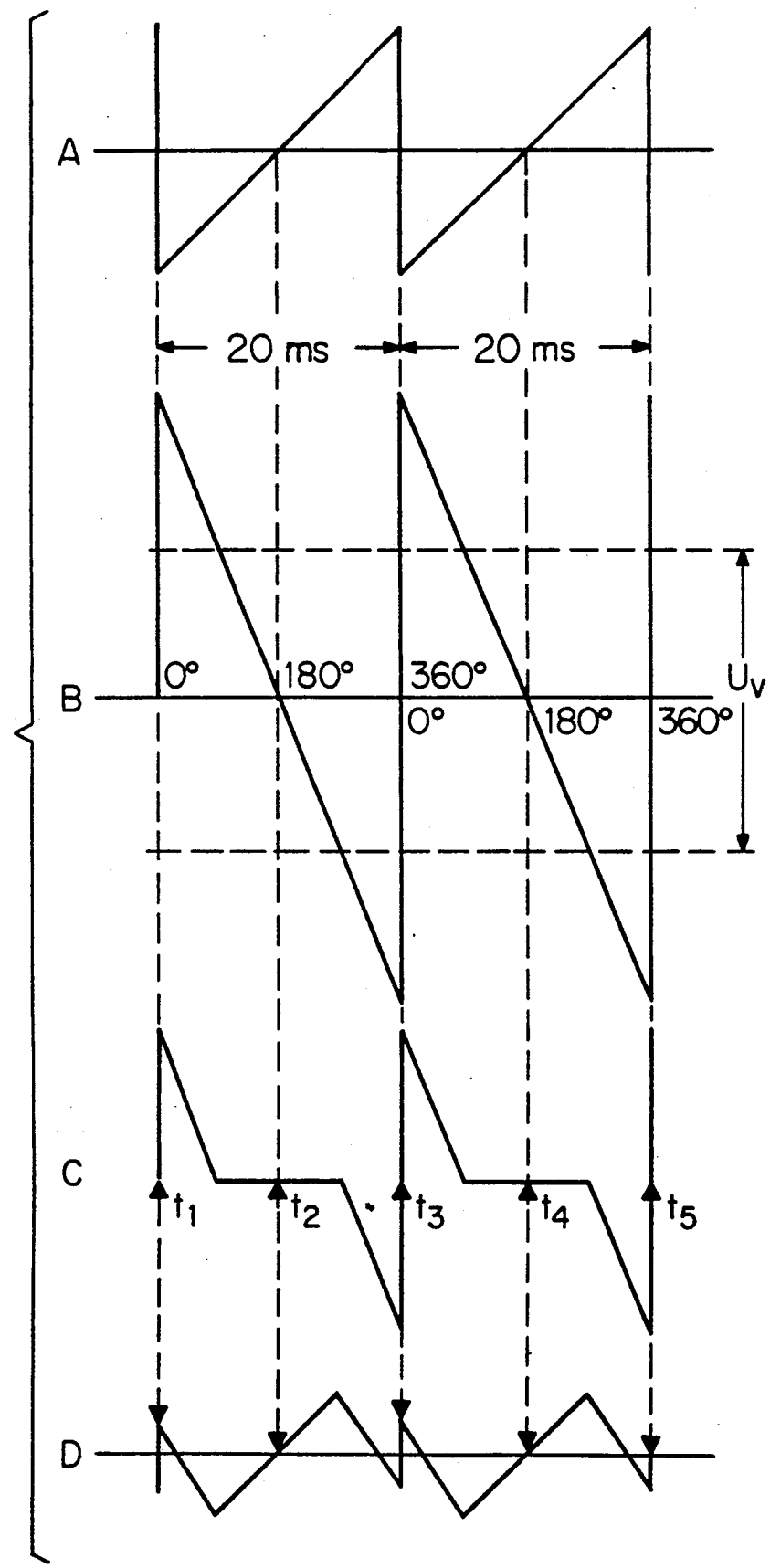
FIG. 2 is a graph illustrating how the invention works.

A vertical-frequency sawtooth signal V is supplied to the input terminal 3 of the amplifier stage 4 illustrated in FIG. 1. A signal A (FIG. 2A) with the same phase as signal V is obtained from the emitter resistor 5 of amplifier stage 4 and forwarded to an adding circuit 1. A signal B (FIG. 2B) that is opposite in phase to signal V is obtained from the collector resistor 6 of amplifier stage 4 and forwarded to a diode bridge 2 by way of a capacitor 7. The peaks of voltage B produce a bias for diode bridge 2 in an RC stage 8 and 9. A signal voltage C (FIG. 2C) with horizontal sections resulting from the bias occurs at the output terminal of diode bridge 2. Signal C is forwarded to the other input terminal of adding circuit 1. If, now, the amplitudes of the voltages forwarded to the adding circuit have not been equalized but are, as recited in the major claim, different, the wave form illustrated in FIG. 2D will appear at the output terminal of the adding circuit. Since there is an inverted section at the beginning and end of each vertical period, a correction of this type can be employed to obtain the desired effect. The different, amplitudes of the voltages that are to be added can be obtained either by applying different voltages early on, to the input terminals of adding circuit 1, or by employing differently dimensioned summing resistors 13 and 14. The resulting signal D arrives at an amplification stage 11 by way of a coupling capacitor 10 and is uncoupled by way of a capacitor 12.

We claim:

1. A method for generating a voltage with a triangular waveform independent of frequency comprising the steps: producing two oppositely-phased voltages with sawtooth waveforms of different amplitudes and with one of said oppositely-phased voltages having a horizontal waveform during predetermined intervals of a period; and adding said two oppositely-phased voltages together in an adding circuit, time instants at which said triangular waveform pass through zero coinciding with time instants at which said sawtooth waveforms pass through zero.

2. A method as defined in claim 1, wherein said two oppositely-phased voltages have different amplitudes when arriving at said adding circuit.

3. A method as defined in claim 1, wherein said two oppositely-phased voltages have the same amplitude when arriving at said adding circuit; and reducing the amplitude of one said two oppositely-phased voltages below the amplitude of the other one of said two voltages within said adding circuit.

4. A method as defined in claim 1, wherein said time instants at which said waveforms pass through zero correspond to beginnings and ends of the sawtooth waveform.

5. A method for generating a voltage with a triangular waveform independent of frequency comprising the steps: producing two oppositely-phased voltages with sawtooth waveforms of different amplitudes and with one of said oppositely-phased voltages having a horizontal waveform during predetermined intervals of a period; and adding said two oppositely-phased voltages together in an adding circuit, time instants at which said triangular waveform pass through zero coinciding with time instants at which said sawtooth waveforms pass through zero, said time instants at which said waveforms pass through zero corresponding to 0°, 180°, and 360° of a waveform cycle for eliminating substantially gullwing errors from bent horizontal lines in television sets due to substantially flat viewing screens.

6. A method as defined in claim 5, wherein said time instants at which said waveforms pass through zero correspond to beginning, center and end of a picture frame in said television sets.

7. A method for generating a voltage with a triangular waveform independent of frequency comprising the steps: producing two oppositely-phased voltages with sawtooth waveforms of different amplitudes and with one of said oppositely-phased voltages having a horizontal waveform during predetermined intervals of a period; and adding said two oppositely-phased voltages together in an adding circuit, time instants at which said triangular waveform pass through zero coinciding with time instants at which said sawtooth waveforms pass through zero, said two oppositely-phased voltages being produced by an amplifier having a sawtooth signal input, one of said two oppositely-phased voltages being connected directly from said amplifier to one input of said adding circuit, the other one of said oppositely-phased voltages being applied to a second input of said adding circuit through a diode bridge having a resistor-capacitor network for imparting horizontal sections to the other oppositely-phased voltage.

8. A method as defined in claim 7, wherein said two oppositely-phased voltages have different amplitudes when arriving at said adding circuit.

9. A method as defined in claim 7, wherein said two oppositely-phased voltages have the same amplitude when arriving at said adding circuit; and reducing the amplitude of one said two oppositely-phased voltages below the amplitude of the other one of said two voltages within said adding circuit.

* * * * *